United States Patent [19]
DiFrancesco

[11] Patent Number: 4,804,132
[45] Date of Patent: Feb. 14, 1989

[54] METHOD FOR COLD BONDING
[76] Inventor: Louis DiFrancesco, 31032 Hershey Way, Hayward, Calif. 94549
[21] Appl. No.: 90,608
[22] Filed: Aug. 28, 1987
[51] Int. Cl.⁴ ............................................. B23K 21/00
[52] U.S. Cl. .................................... 228/115; 228/116; 228/208
[58] Field of Search ............... 228/115, 116, 208, 248, 228/263.17; 29/521

[56] References Cited
U.S. PATENT DOCUMENTS 3,100,933  8/1963  Hancock et al. ...................... 228/116
3,203,083  8/1965  Obenhaus ............................ 228/115
3,482,726  12/1969 Schroeder, Jr. ..................... 228/115
3,555,664  1/1971  Bingham et al. ..................... 228/115
3,921,885  11/1975 Knox .................................. 228/208

FOREIGN PATENT DOCUMENTS
2158757  11/1985  United Kingdom ............... 228/208

Primary Examiner—Kurt Rowan
Attorney, Agent, or Firm—Keith Kline

[57] ABSTRACT

The present invention is a method for bonding two surfaces without applying heat. The surfaces are prepared so that they both have an outermost layer of aluminum. One of the surfaces has metallized particles that protrude at the desired bonding points. When the two surfaces are brought into contact, the particles pierce the aluminum surface, displacing any aluminum oxide that may be present. This provides two virgin aluminum surfaces on contact with each other, which allows the formation of a metal matrix, thus bonding the two surfaces. The strength of the bond can be controlled by varying the piercing depth and size of the particles. The material for the particles may be chosen so that the bond is both electrically and thermally conductive, either electrically or thermally conductive, or both electrically and thermally insulative.

18 Claims, 1 Drawing Sheet

METHOD FOR COLD BONDING

TECHNICAL FIELD

The present invention relates generally to the field of structural adhesives and more specifically to a method of bonding for integrated circuit fabrication.

BACKGROUND ART

The development of the integrated circuit ("IC") has led to the establishment of a multi-billion dollar industry. The ability to miniaturize electrical circuitry has found countless applications. Equipment that was formerly large and cumbersome can now be reduced greatly in size, while retaining and/or expanding the equipment capabilities. The development of the handheld calculator is one of the more dramatic examples of an IC application.

With the advancement of IC technology, many of the products themselves have become inexpensive commodities. This statement refers specifically to the chips themselves, which are sold in a very competitive commodity market. This situation tends to create a shift of emphasis from the product to the manufacturing process. When a manufacturer does not have a significant technological advantage, he must either make his product with higher quality or sell it for a lower price in order to remain competitive. Therefore, the manufacturing process comes under more exacting scrutiny.

One element of the IC manufacturing process is the interconnect bonding which occurs during construction of the chip. There are at least four techniques in the prior art for accomplishing interconnect bonding.

A first technique is wire bonding. Wire bonding is accomplished either ultrasonically, by utilizing high frequency pressure waves to rapidly rub the subject leads together until a bond is formed; thermally, by forming a weld through heating under pressure; or a combination of both thermal and ultrasonic bonding. A disadvantage of this technique is that it is relatively slow due to the fact that each wire end must be individually connected. A further disadvantage of wire bonding is that IC technology has reached the density limits imposed by wire bonding.

A second technique is tape automated bonding ("TAB"). TAB bonding makes use of a photolithographic metallized plastic film. TAB is utilized in the same way as wire bonding, but for mass group applications. The tape material may be applied by soldering, or by ultrasonic or thermal bonding. A disadvantage of TAB is that expensive tooling is required for mass bonding, which is a widely required process. Another disadvantage of TAB is that due to the geometry of the method, a considerable area on the dies' perimeter is occupied, thus limiting the packing density of dies. Finally although TAB allows greater connection density than wire bonding, IC technology has also reached the limits imposed by TAB.

A third technique is to simply use a solder bump. A bump of lead or gold tin solder is applied to the connection site and then heated so that it liquefies. The bump then solidifies as it cools so that a conductive joint is formed. A disadvantage of the solder bump method is that it requires the presence of metal above active circuitry, thus slowing electrical signal propagation. Further, the solder bump requires relatively large attachment sites and cannot be inspected after reflow soldering. Density limitations limit the usefulness of this technique as well.

The fourth technique is a form of cold interconnect bonding. This method entails the use of gold/indium bumps at the connection site. This method is based upon the fact that indium plasticizes at about 29° C. (85° F.). Therefore when moderate pressure, without added heat, is applied, the indium will liquefy. When the pressure is removed, the indium will solidify so that a bond is formed at the connection site. A disadvantage of the indium bump bond is that it has limited usage since, due to the fact that indium plasticizes at around 20° C. (85° F.), it can only be utilized in a system that does not experience elevated temperatures due to heat accumulation, e.g. a cryogenically cooled system. Moreover, indium bump bonds are extremely fragile and are unusually sensitive to contamination during fabrication and while in use. In sum, all the bonding methods in the prior art, due to geometric and other considerations, limit the extent to which IC technology can advance. Further the processes required to achieve the bonds may be relatively lengthy.

DISCLOSURE OF THE INVENTION

Accordingly, it is an object of the present invention to provide a method for bonding that does not require the application of heat.

It is a further object of the present invention to provide a method that can form bonds of variable strength.

It is another object of the present invention to minimize manufacturing process steps performed.

It is yet another object of the present invention to reduce the geometric limitations of the present methods.

A still further object of the present invention is to provide a method that is inexpensive relative to the prior art, that can be implemented with minimal equipment expenditures, and that is widely applicable.

Yet another object of the present invention is to provide a connection bonding method that can be rapidly completed.

Still another object of the present invention is to provide a bonding method that minimizes heat dissipation problems during operation.

Another object of the present invention is to provide a bond that can be, depending on choice of materials only, thermally and electrically conductive or insulative in any desired combination.

Briefly, a preferred embodiment of the present invention is a method for cold bonding that can be specifically adapted to IC manufacturing. The method requires no addition of heat to the bonding site. The method achieves the bond via a microweld that occurs when a surface of virgin (non-oxidized) aluminum is exposed to another virgin aluminum surface. Due to the extremely active nature of aluminum, a metal matrix is formed when one virgin aluminum surface is mated to another virgin aluminum surface. The virgin aluminum surfaces are provided by means of a metallized particle piercing the oxide layer of the subject aluminum contact pad, displacing the oxide from both surfaces. The strength of the bond formed is dependent upon the amount of surface area of virgin aluminum, and is thus a function of the piercing depth and particle size.

An advantage of the present invention is that an ohmic connection can be obtained between two metallic surfaces without using applied heat.

Another advantage of the present invention is that its geometry is such that there is a capability for far greater densities than with prior art methods.

A further advantage is that in a die/package application of the present invention, contact/lead resistance and capacitance is reduced.

A still further advantage of the present invention is that IC fabrication costs can be saved by both the reduction of the use of precious metals and the elimination of certain process steps.

Another advantage of the present invention is that it provides a means for consistent mass terminations with minimal equipment expanditures.

Still another advantage of the present invention is that it may be accomplished with plentiful and inexpensive materials.

A further advantage is that area as well as periphery bonding can be accomplished.

A still further advantage is that "flip chip" technology can be used with standards equivalent to wire bonding. (Flip chip technology is the technology wherein chips are processed "face down" as opposed to the normal "face up".)

These and other objects and advantages will become clear to those skilled in the art in view of the description of the best presently known mode of carrying out the invention and the industrial applicability of the preferred embodiment as described herein and as illustrated in the drawings.

BEST MODE OF CARRYING OUT THE INVENTION

Figure 1:
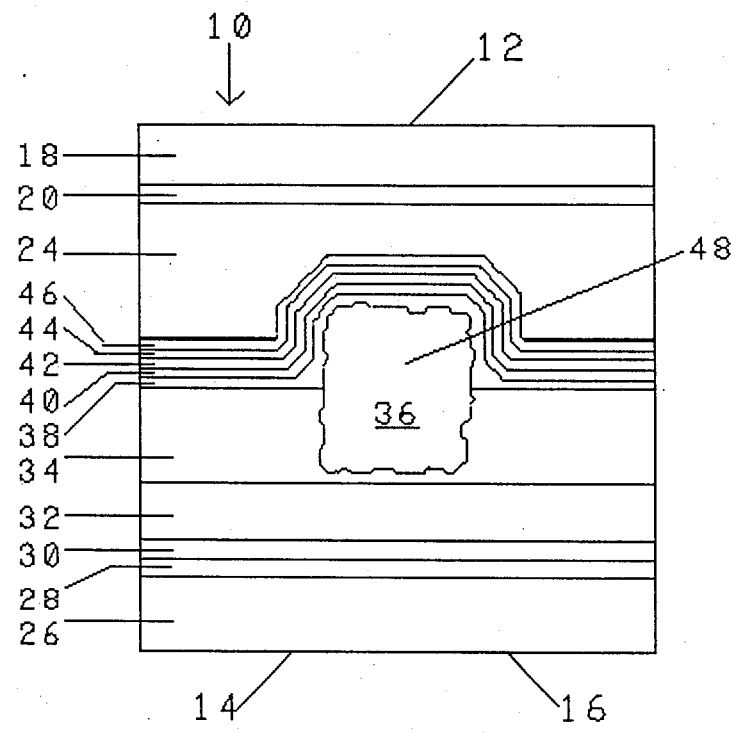
FIG. 1 is a cross sectional view of a bonding site formed by means of the present invention.

The present invention is a method for cold bonding of two surfaces. It is envisioned that the method will have numerous and varied applications. One of the major applications, a preferred embodiment of the present invention, is the die/package interconnect bond 10. FIG. 1 illustrates the bond formed by the method of the present invention.

In the IC fabrication process, the individual dies 12 must be bonded to a support package 14. The dies 12 are bonded to the package 14 via the dies 12 contacting a bond pad 16 formed on the package 14. The preferred embodiment of the present invention is a new method to achieve the die/package interconnect bond 10.

The die 12 is prepared by applying metal layers to a die substrate 18 through photolithographic or material addition processes. To begin, a first bonding layer 20, selected for malleability and conductivity, is applied. To the first bonding layer 20 a first aluminum layer 24 is applied. The die 12 is then ready for bonding.

The bond pad 16 is also constructed of layers deposited upon a pad substrate 26. Similar to the die 12 preparation, the bond pad 16 has a second bonding layer 28 (similar to the first bonding layer 20), a first barrier metal layer 30, and a low resistance trace layer 32, all applied to the pad substrate 28, in the order stated. However, the bond pad 16 requires further preparation.

The next step in preparation of the pad 16 in the preferred embodiment is to deposit a metal layer 34 with particles 36 reverse transfer molded therein onto the trace layer 32 of the pad 16. Reverse transfer molding is a well known, commercially available process. Other processes, such as plating, can also be used to secure the particles 36 in position. The particles 36 are covered by a particle bonding layer 38, then by a particle barrier layer 40. The result at this point is that the bond pad 16 has particles 36 secured in and protruding from the metal layer 34. The location of the particles 36, and the extent to which they protrude from the metal layer 34, is determined by the topography of the die 12. That is, the particles 36 are photomasked into place to correspond with the contour of the die 12.

To facilitate applications in which breaking the bond is sometimes necessary, e.g. for rework operations, the pad 16 may be further prepared by applying a breakaway layer 42. The purpose of the breakaway layer 42 is to define the point at which the bond 10 can be most easily broken. Accordingly, the force and amount of heat required to break the bond can be altered by varying the material used for the breakaway layer 42.

Finally, a second barrier layer 44 and a second aluminum layer 46 is applied. The end result is that the bond pad 16 now has metalized particles 48 which protrude from the pad 16 at the sites where bonding with the die 12 is desired.

When bonding is to occur, the die 12 is brought into physical contact with the package 14. This causes the metalized particles 48 protruding from the bond pad 16 to contact the appropriate connection site on the die 12. When essentially perpendicular force is applied, the metalized particles 48 displace any oxide present on the aluminum layers 24 and 46 so that two surfaces of virgin aluminum contact each other.

Because virgin aluminum is very reactive, the two aluminum layers 24 and 46 form a metal matrix, thus creating a bond 10. The strength of the bond is dependent on the extent of formation of the metal matrix, which is a function of the amount of virgin aluminum that has been exposed. Therefore, the strength of the bond 10 formed can be controlled by the depth of the penetration of the metalized particles 48. For a temporary testing bond, the penetration is slight. If the tests prove positive, the penetration is simply increased by addition of further pressure, and a more permanent bond is formed.

As stated previously, the materials chosen for the various components of the die 12 and bond pad 16 can be varied to control the electrical and thermal conductivity properties of the bond 10. It is further understood that specific materials can be varied widely, while still following the teachings of this invention. However, in the preferred embodiment, a die/package interconnect bond 10, the materials are as set forth below.

The die substrate 18 is silcon. To this the thin first bonding layer 20 of platinum alloy is applied. This layer is covered by the first aluminum layer 24, whose thickness and contour are determined by the specific application.

The pad substrate 26 is usually alumina, beryllium oxide, or polyamide, and may sometimes be silicon as well. Thinly applied to this are the second bonding layer 28 of nickel/chrome and the first barrier metal layer 30 of nickel. Next is the low resistance trace layer 32, which in this embodiment is gold. Then, the third nickel/chrome bonding layer 38 and the nickel particle barrier layer 40 are applied. This provides a suitable surface to apply the breakaway layer 42. The material for the breakaway layer 42 is chosen so that this layer is where the bond 10 can be most easily broken through the application of heat and force. In this embodiment, the breakaway layer 42 is gold/tin alloy. To provide better adhesion of the second aluminum layer 46, a barrier layer 44 of nickel is applied to the breakaway layer 42.

The particles 36 will usually be industrial diamond. Note that recent material technology advances provide diamond that is electrically conductive. It should also be noted that the size of the particles 36 can vary greatly. In this embodiment for IC's, the size of the particles 36 limits the obtainable density. The fact that the particles 36 can be as small as one micron is what allows for the density increase relative to the prior art bonding technologies. In other applications of the present invention, the particles 36 may be orders of magnitude larger. For example, large chunks may be used in an application where it is desired to bond metal plates together.

It is also envisioned that the present invention will be used in applications where it is required that the particles 36 be both thermally and electrically insulating. When that is the case, the particles 36 will be alumina, quartz, borosilicate, or the like.

Those skilled in the art will readily observe that numerous modifications and alterations of the disclosed bonding method may be made while retaining the teachings of the invention. Accordingly, the above disclosure is not intended as limiting. The appended claims are therefore to be interpreted as encompassing the entire spirit and scope of the invention.

INDUSTRIAL APPLICABILITY

The cold bonding method of the present invention has enormous potential for industrial application. Currently in the IC fabrication process, wafer sorting through final package test entails five distinct operations. The variable bond strength feature of the present invention allows those steps to be combined into one operation. Instead of forming a permanent bond to test the package, the present invention allows a temporary bond, sufficiently strong for testing purposes, to be formed. If the die tests as good, additional pressure can be applied so that the bond is made permanent. If the die is bad, it is easily replaced. With the prior art methods, the permanent nature of the bonds demanded that extensive rework be performed to replace a bad die. (The alternative being disposal of a part that had already had value added.) A conservative estimate is that processing time can be reduced by 25%. This application alone will make the present invention of tremendous utility in the IC industry.

Moreover, the present technology has other applications as well. Wafer probe fabrication can now be automated, through the use of a photomask (pad master). Hybrid circuits can be more efficiently tested, as the present invention will allow the final hybrid configuration to be more closely simulated prior to bonding and during mass termination of multiple dies during bonding.

Further, it is envisioned that the present technology will allow for wafer scale testing. The method of the present invention allows for the burn-in probe to be on a material that will not become flexible when heated, e.g. silicon or borasilicate glass.

Moreover, the geometry of the present invention, due to the ability to easily control the particle size, allows for much greater circuit density. With the present invention, a 2 micron pad size is potentially feasible, as compared to the industry norm of pad size, which is 150-160 microns. This factor clearly pushes back one of the limits currently restricting circuit density.

For the reasons stated above, it is envisioned that the present invention will greatly enhance IC manufacturing. Given the characteristics of the IC market, such improvement will be eagerly accepted. Further, the present invention has various additional applications as described above. Therefore, it is expected that the present invention will enjoy widespread commercial viability and industrial utility.

I claim:

1. A method for bonding two surfaces together without applying heat, the bond being formed via a metal matrix that is created when the two surfaces, having been prepared so that both surfaces have an outermost layer of aluminum, are brought into contact with each other in a manner so as to displace any aluminum oxide present, thus providing the contact of two virgin (non-oxidized) aluminum surfaces, wherein one of the surfaces to be bonded is prepared so that, at desired bonding points, aluminum coated particles protrude from the surface, providing discrete contact points with the other surface.

2. The method of claim 1 wherein:
said particles pierce the surface of the aluminum and cause any oxide layer present to be displaced so that virgin aluminum surfaces are exposed.

3. The method of claim 2 wherein:
said particles are industrial grade diamonds.

4. The method of claim 2 wherein:
said particles are chosen from the class of alumina, quartz, and borosilicate.

5. The method of claim 2 wherein:
the strength of the bond formed is variable and is controlled by the depth of piercing and size of said particle, and hence the surface area of virgin aluminum exposed.

6. The method of claim 2 wherein:
the surfaces are prepared by applying various metal layers through photolithographic or metal addition processes, the outermost layer necessarily being aluminum.

7. The method of claim 6 wherein:
a breakaway layer is provided on one of the surfaces, the breakaway layer being formed from a material chosen so as to have the lowest melting point of any of the metal layers.

8. The method of claim 2 wherein:
the material for the particles may be chosen so as to be both electrically and thermally conductive, either electrically or thermally conductive, or both electrically and thermally insulative.

9. A method for die/package interconnect bonding, the bond being a metal matrix formed between an outer layer of virgin aluminum on the die and an outer layer of virgin aluminum on a bond pad of the package, wherein the package is formed to include a plurality of metalized particles protruding from its surface at the desired bonding spots so that when the die and package are brought together, said particles first contact the bond pad and displace any aluminum oxide that may be present, thus providing the mating of two virgin aluminum surfaces.

10. The method of claim 9 wherein:
the material to be used for said particles is chosen so as to control the electrical and/or thermal conductivity of the interconnect bond.

11. The method of claim 9 wherein:

the strength of the interconnect bond is controlled by the depth of piercing and size of the particles and choice of exterior metal layer.

12. The method of claim 9 wherein:
a breakaway layer is provided on the die, the breakaway layer being a material with a melting point lower than that of the other materials present on the die, so that when heat is applied, the bond is broken at the breakaway layer.

13. The method of claim 9 wherein:
the material for the particles is either industrial diamond or from the class of alumina, quartz, and borosilicate.

14. A method for bonding together a first generally locally planar surface and a second generally locally planar surface, in steps comprising:
   A. coating the first surface with a first layer of aluminum;
   B. coating the second surface with a second layer of aluminum including a plurality of discrete particles embedded therein at selected bonding zones, said discrete particles being completely coated, on the exterior facing surfaces thereof, by said second layer of aluminum; and
   C. forcing the first surface against the second surface in a perpendicular manner such that said particles embedded in said second layer of aluminum pierce both said second layer and said first layer of aluminum, the force of such piercing exposing juxtaposed areas of virgin aluminum in both of said first and said second layers, such that adjacent exposed areas of virgin aluminum are caused to bond to each other by material affinity.

15. The method of claim 14 wherein said particles are selected to be multifaceted such that said piercing displaces maximal aluminum.

16. The method of claim 14 wherein a light amount of force is utilized in step C, such that the degree of said piercing is slight and disengagement of the bond may be accomplished with slight detriment to said first and said second aluminum layers.

17. The method of claim 16 and further including the following steps:
   D. inspecting/testing the juxtapositional alignment of the first and second surfaces to assure that desired alignment has been achieved; and
   E. repeating step C with a greater amount of force such that a greater degree of piercing is achieved and a more permanent bond is formed.

18. The method of claim 14 wherein:
said particles are selected to be irregular solids having effective diameters less than the sum of the thicknesses of said first layer of aluminum and said second layer of aluminum, thus assuring said particles do not pierce the first and second surfaces and cause detriment thereto.

* * * * *